(12) United States Patent
Kajimoto et al.

(10) Patent No.: US 10,734,455 B2
(45) Date of Patent: Aug. 4, 2020

(54) ORGANIC DEVICE, DISPLAY APPARATUS, IMAGING APPARATUS, ILLUMINATION APPARATUS, MOBILE APPARATUS LIGHTING APPLIANCE, AND MOBILE APPARATUS

(71) Applicant: CANON KABUSHIKI KAISHA, Tokyo (JP)

(72) Inventors: Norifumi Kajimoto, Zama (JP); Tetsuo Takahashi, Kawasaki (JP); Koji Ishizuya, Fujisawa (JP); Hiroaki Sano, Chofu (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/448,683

(22) Filed: Jun. 21, 2019

(65) Prior Publication Data

US 2019/0393272 A1    Dec. 26, 2019

(30) Foreign Application Priority Data

Jun. 21, 2018 (JP) ................. 2018-118192

(51) Int. Cl.
*G09G 3/20* (2006.01)
*H01L 27/32* (2006.01)
*H01L 51/52* (2006.01)

(52) U.S. Cl.
CPC ......... *H01L 27/322* (2013.01); *G09G 3/2003* (2013.01); *H01L 27/3209* (2013.01); *H01L 51/5203* (2013.01)

(58) Field of Classification Search
CPC ............... G09G 3/2003; G09G 3/3208; G09G 2300/0023; G09G 2300/0426; H01L 27/322; H01L 27/3209; H01L 27/3283; H01L 27/3246; H01L 51/5203; H01L 51/5281

See application file for complete search history.

(56) References Cited

U.S. PATENT DOCUMENTS 8,063,398 B2 * 11/2011 Toerker ............... H01L 27/3246
                                                  257/40
8,581,275 B2    11/2013 Omoto
                        (Continued)

FOREIGN PATENT DOCUMENTS

JP          2012-155953 A      8/2012
JP          2014-52582 A       3/2014

*Primary Examiner* — Ryan A Lubit
(74) *Attorney, Agent, or Firm* — Venable LLP

(57) ABSTRACT

An organic device is provided. The device comprises a substrate and a plurality of light emitting elements formed on a first surface of the substrate. Each of the plurality of light emitting elements includes, from a side of the first surface, a first electrode, an organic layer formed on the first electrode and including a light emitting layer, and a second electrode formed on the organic layer. The organic device further comprises a third electrode formed between the first electrodes of adjacent light emitting elements of the plurality of light emitting elements, and an insulating layer covering a portion between the first electrode and the third electrode, an end portion of the first electrode, and an end portion of the third electrode. The insulating layer includes a recess between the first electrode and the third electrode.

20 Claims, 7 Drawing Sheets

(56) References Cited

U.S. PATENT DOCUMENTS

| | | | |
|---|---|---|---|
| 8,987,760 B2 | 3/2015 | Omoto | |
| 10,559,775 B2* | 2/2020 | Sakamoto | H01L 51/5215 |
| 2012/0187425 A1* | 7/2012 | Omoto | H01L 27/3211 |
| | | | 257/88 |
| 2013/0285034 A1* | 10/2013 | Akamatsu | H05B 33/22 |
| | | | 257/40 |
| 2014/0124765 A1 | 5/2014 | Omoto | |
| 2019/0096971 A1* | 3/2019 | Ukigaya | H01L 51/5088 |
| 2019/0386248 A1* | 12/2019 | Itonaga | H01L 51/5253 |

* cited by examiner

F I G. 10
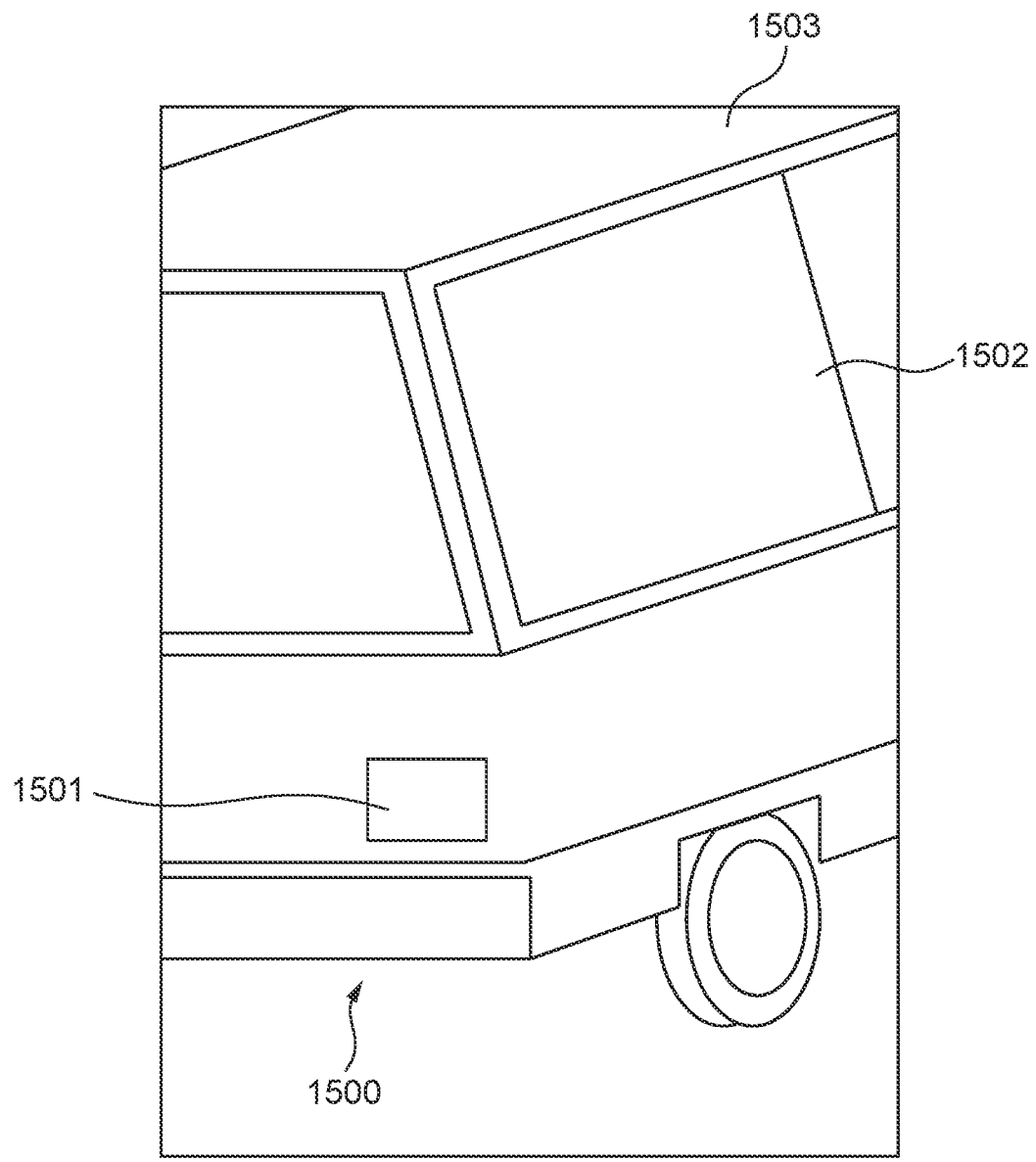

ORGANIC DEVICE, DISPLAY APPARATUS, IMAGING APPARATUS, ILLUMINATION APPARATUS, MOBILE APPARATUS LIGHTING APPLIANCE, AND MOBILE APPARATUS

BACKGROUND OF THE INVENTION

Field of the Invention

The present invention relates to an organic device, a display apparatus, an imaging apparatus, an illumination apparatus, a mobile apparatus lighting appliance, and a mobile apparatus.

Description of the Related Art

An organic device including an organic EL light emitting element is attracting attention. A system (to be referred to as a white+CF system) using a light emitting element for emitting white light and a color filter in order to increase the resolution of the organic device is known. Since the white+CF system forms an organic layer on the entire substrate surface, it is easy to increase the resolution by adjusting, for example, the pixel size and the pitch between the pixels, when compared to a system that forms an organic layer for each color by using a metal mask. In the white+CF system, however, the formed organic layer is common to all light emitting elements, a driving current leaks between adjacent light emitting elements through the organic layer, and causes a crosstalk between the light emitting elements, such as color mixture or a decrease in efficiency. Japanese Patent Laid-Open No. 2012-155953 discloses a structure in which a metal interconnection that surrounds an anode electrode formed for each light emitting element and is electrically connected to an organic layer is formed, and an electric current that leaks between adjacent light emitting elements is caused to flow through the metal interconnection. Japanese Patent Laid-Open No. 2014-52582 discloses a structure in which an electrode covered with an insulating layer is formed between electrodes formed for each light emitting element, and a voltage is applied to the electrode covered with the insulating layer, thereby generating an electric field so as to suppress a leak between adjacent light emitting elements.

In the structure disclosed in Japanese Patent Laid-Open No. 2012-155953, the resistance between the anode electrode and the metal interconnection is lower than that of the organic layer between the anode electrode and a cathode electrode in a low-luminance region. In the low-luminance region, therefore, an electric current flowing from the anode electrode to the metal interconnection becomes larger than that flowing through the organic layer from the anode electrode to the cathode electrode, and this may make it difficult to control the luminance. In the structure disclosed in Japanese Patent Laid-Open No. 2014-52582, the suppression of a leak between adjacent light emitting elements may become insufficient and cause color mixture.

SUMMARY OF THE INVENTION

The present invention provides a technique advantageous in suppressing a leak between light emitting elements in an organic device.

According to some embodiments, an organic device comprising a substrate and a plurality of light emitting elements formed on a first surface of the substrate, wherein each of the plurality of light emitting elements includes, from a side of the first surface, a first electrode, an organic layer formed on the first electrode and including a light emitting layer, and a second electrode formed on the organic layer, the organic device further comprises a third electrode formed between the first electrodes of adjacent light emitting elements of the plurality of light emitting elements, and an insulating layer covering a portion between the first electrode and the third electrode, an end portion of the first electrode, and an end portion of the third electrode, and the insulating layer includes a recess between the first electrode and the third electrode, is provided.

Further features of the present invention will become apparent from the following description of exemplary embodiments (with reference to the attached drawings).

BRIEF DESCRIPTION OF THE DRAWINGS

FIG. 10 is a view showing an example of an automobile using the organic device shown in FIG. 1.

DESCRIPTION OF THE EMBODIMENTS

Figure 1:
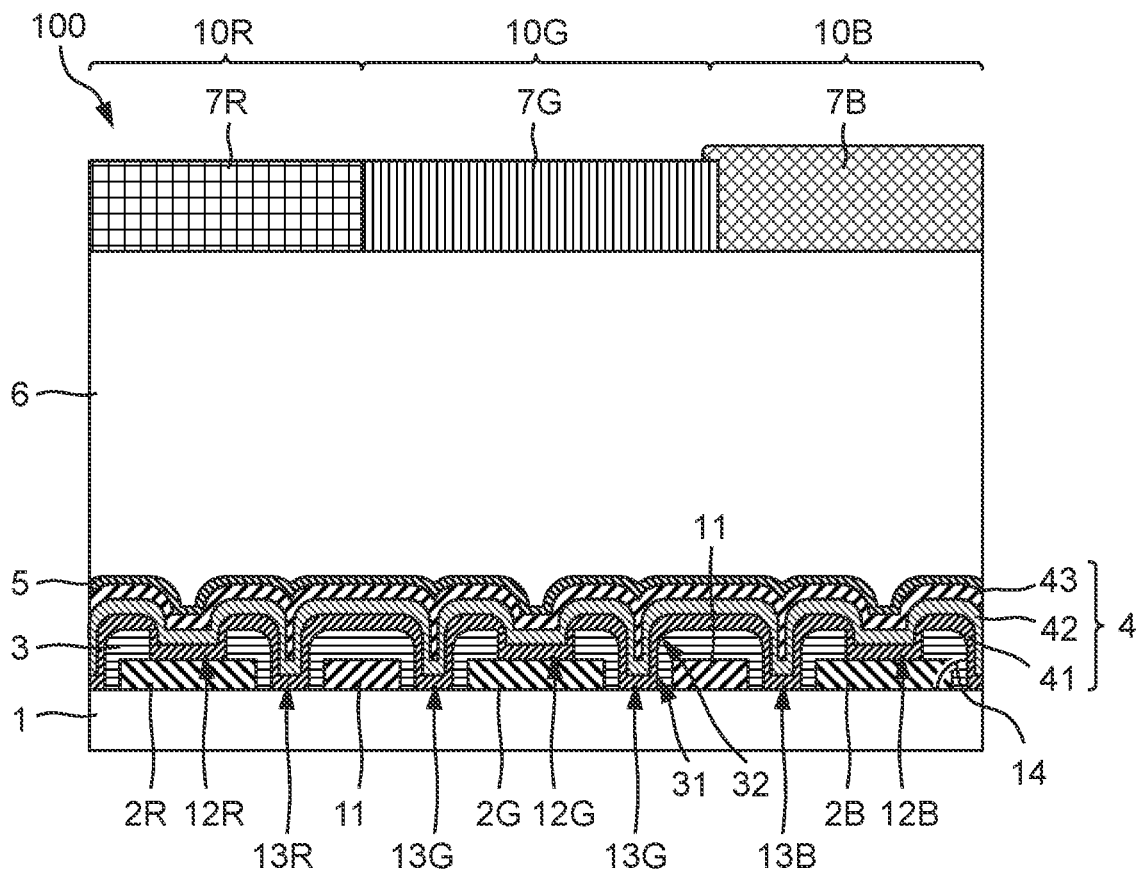
FIG. 1 is a sectional view schematically showing the structure of an organic device according to an embodiment of the present invention.

Practical embodiments of an organic device according to the present invention will be explained below with reference to the accompanying drawings. Note that in the following explanation and drawings, the same reference numerals denote the same components throughout the plurality of drawings. Therefore, the same components will be explained by mutually referring to the plurality of drawings, and an explanation of the components denoted by the same reference numerals will be omitted as needed.

Figure 2:
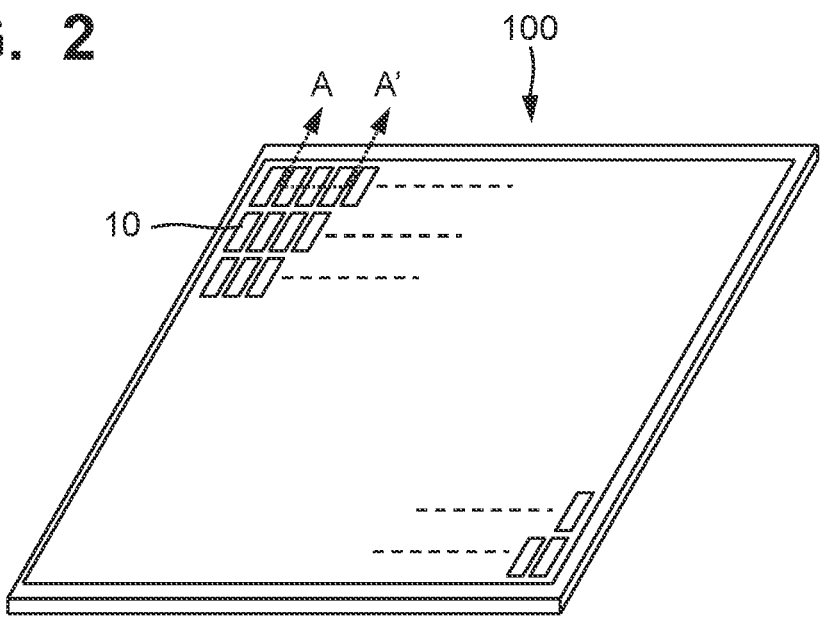
FIG. 2 is a perspective view schematically showing the structure of the organic device shown in FIG. 1.

An organic device according to an embodiment of the present invention will be explained below with reference to FIGS. 1 to 10. FIG. 1 is a sectional view schematically showing the structure of an organic device 100 according to the present invention. FIG. 2 is a perspective view of the organic device 100. A section taken along a line A-A' in FIG. 2 is the sectional view shown in FIG. 1, in which three light emitting elements 10 form one pixel. This embodiment discloses pixels formed into a stripe array as an example, but the present invention is not limited to this, and a delta array or a square array may also be used.

The organic device 100 includes a substrate 1 and a plurality of light emitting elements 10 arranged on the upper surface (a first surface) of the substrate 1. FIG. 1 shows three light emitting elements 10R, 10G, and 10B of the plurality of light emitting elements 10 included in the organic device 100. In this specification, when indicating a specific light emitting element of the plurality of light emitting elements 10, a suffix is added to the reference numeral like a light emitting element 10"R". When indicating any light emitting element, the light emitting element is simply indicated by a light emitting element "10". This similarly applies to other constituent elements.

The plurality of light emitting elements 10 include, from the upper surface side of the substrate 1, a lower electrode 2 (a first electrode) separated for each of the plurality of light emitting elements 10 by an insulating layer 3, an organic layer 4 including a light emitting layer 42 covering the lower electrodes 2 and the insulating layer 3, and an upper electrode 5 (a second electrode) covering the organic layer 4. The organic device 100 of this embodiment is a top-emission device in which light is extracted from the upper electrode 5. The organic device 100 further includes an encapsulating layer 6 so formed as to cover the upper electrode 5, and a plurality of color filters 7 formed on the encapsulating layer 6 corresponding to each of the plurality of light emitting elements 10. In this embodiment, the organic layer 4 emits white light, and color filters 7B, 7G, and 7R convert the white light emitted from the organic layer 4 into their respective desired colors. In this specification, terms "upper" and "lower" will be used such that the side on which the color filters 7 are formed is expressed as "upper" with respect to the position where the substrate 1 is formed, such that the color filters 7 are formed on the "upper" side of the substrate 1, and the opposite side will be expressed as "lower". As described above, therefore, one of the principal surfaces of the substrate 1, on which the lower electrodes 2 and the like are formed, will be called the "upper" surface.

The organic device 100 further includes an inter-element electrode 11 (a third electrode) formed between the lower electrodes 2 of adjacent light emitting elements 10 of the plurality of light emitting elements 10. The inter-element electrode 11 can be so formed as to surround the outer circumference of the lower electrode 2. In this embodiment, the inter-element electrode 11 is covered with the insulating layer 3. The inter-element electrode 11 is electrically independent of the lower electrode 2 and the upper electrode 5.

The inter-element electrodes 11 may also be formed in a number equal to the number of lower electrodes 2, in order to suppress an increase in number of processing steps for manufacturing the organic device 100. In this case, the lower electrodes 2 and the inter-element electrodes 11 are formed at the same height in a direction perpendicular to the upper surface of the substrate 1. Also, the upper surfaces of the lower electrode 2 and the inter-element electrode 11 have the same height (an unevenness caused by the difference between the heights of the lower electrode 2 and the inter-element electrode 11 is suppressed). Since this improves the uniformity of each layer to be deposited after the lower electrodes 2 and the inter-element electrodes 11 are formed, the manufacturing yield of the organic device 100 can improve.

The insulating layer 3 covers a portion between the lower electrode 2 and the inter-element electrode 11, the end portion of the lower electrode 2, and at least the end portion of the inter-element electrode 11. In this embodiment as described above, the insulating layer 3 covers the whole inter-element electrode 11. Also, the insulating layer 3 has a recess 13 between the lower electrode 2 and the inter-element electrode 11. In the direction perpendicular to the surface of the substrate 1, the recess 13 has a depth equal to or larger than the thickness of the lower electrode 2 and the inter-element electrode 11. The depth of the recess 13 is the difference between the height of the upper surface of that portion of the insulating layer 3, which is formed on the lower electrode 2 or the inter-element electrode 11, and the height of the bottom surface of the recess 13, in the direction perpendicular to the upper surface of the substrate 1. The sidewall of the recess 13 includes a portion 31 (a first portion) having a predetermined taper angle 14 with respect to the upper surface of the substrate 1, and a portion 32 (a second portion) that is formed between the portion 31 and the upper surface of the insulating layer 3 and changes the angle with respect to the upper surface of the substrate 1. In the portion 32, the angle of the sidewall of the recess 13 with respect to the upper surface of the substrate 1 can continuously or intermittently change.

Also, the insulating layer 3 has an opening region 12 above the lower electrode 2 in order to form a light emitting region of the light emitting element 10 into a desired shape. Accordingly, it can be said that the insulating layer 3 covers the end portion of the lower electrode 2 as described above. As shown in FIG. 1, the insulating layer 3 may also cover the outer edge portion of the lower electrode 2. On the other hand, the insulating layer 3 has no opening region above the inter-element electrode 11, so the inter-element electrode 11 is entirely covered with the insulating layer 3. As will be described in detail later, the film thickness, in the direction perpendicular to the portion 32 of the recess 13, of the organic layer 4 in the portion 32 can be smaller than the film thickness, in the direction perpendicular to the upper surface of the substrate 1, of that portion (in contact with the lower electrode 2) of the organic layer 4, which is formed in the opening region 12. In addition, the film thickness, in the direction perpendicular to the upper surface of the substrate 1, of the organic layer 4 on the bottom surface of the recess 13 can be smaller than the film thickness, in the direction perpendicular to the upper surface of the substrate 1, of that portion of the organic layer 4, which is formed in the opening region 12. This increases the resistance of the organic layer 4 in the direction parallel to the upper surface of the substrate 1, and decreases the resistance of the organic layer 4 in the direction perpendicular to the upper surface of the substrate 1. Consequently, the effect of suppressing a leak of the driving current between adjacent light emitting elements 10, which is caused by raising the potential of the inter-element electrode 11, becomes significant.

The lower electrode 2 can be made of a metal material having a reflectance of 80% or more to the light emission wavelength of the organic layer 4. For example, it is possible to use, as the lower electrode 2, metals such as Al and Ag, and alloys obtained by adding Si, Cu, Ni, and Nd to these metals. The light emission wavelength herein mentioned is the spectral range of light emitted from the organic layer 4. If the reflectance of the lower electrode 2 to the light emission wavelength of the organic layer 4 is high, the lower electrode 2 can have a multilayered structure including a barrier layer. As the material of this barrier layer, it is possible to use metals such as Ti, W, Mo, and Au and alloys of these metals.

The insulating layer 3 can be made of, for example, silicon nitride (SiN), silicon oxynitride (SiON), or silicon oxide (SiO) formed by using chemical vapor deposition (CVD), physical vapor deposition (PVD), or the like. The insulating layer 3 may also be a multilayered film of these materials. As described above, it is effective to make the film thickness of the organic layer 4 smaller in the recess 13 than in the opening region 12, in order to increase the resistance of the organic layer 4 in the direction parallel to the upper surface of the substrate 1. When depositing the organic layer 4 by using vapor deposition or the like, therefore, the film thickness of the organic layer 4 to be formed in the recess 13 can be decreased by controlling the taper angle 14 in the portion 31 of the sidewall of the recess 13 to be formed in the insulating layer 3, or by increasing the film thickness of the insulating layer 3. However, if the sidewall of the recess 13 is steepened or the insulating layer 3 is thickened, the upper electrode 5 may be disconnected above the recess 13. In addition, an air gap is easily formed in the encapsulating layer 6 to be formed on the organic layer 4 and the upper electrode 5. This air gap in the encapsulating layer 6 may generate a dark spot by an encapsulation defect. To suppress a decrease in reliability like this, the taper angle 14 in the portion 31 of the sidewall of the recess 13 in the insulating layer 3 may also be 60° (inclusive) to 90° (inclusive). Also, the film thickness of the insulating layer 3 may also be 40 (inclusive) to 150 (inclusive) nm. The film thickness of the insulating layer 3 can also be the film thickness, in the direction perpendicular to the upper surface of the substrate 1, of the portion formed on the inter-element electrode 11 and covering the inter-element electrode 11.

The organic layer 4 is continuously formed in a direction along the upper surface of the substrate 1, and shared by the plurality of light emitting elements 10. The organic layer 4 may also be integrally formed on the entire surface of a display region, which displays an image, of the organic device 100. Also, as shown in FIG. 1, the organic layer 4 is sandwiched between the lower electrode 2 and the upper electrode 5 and formed in the recess 13 as well. The organic layer 4 may also be buried in the recess 13. The organic layer 4 includes a hole transport layer 41, a light emitting layer 42, and an electron transport layer 43. Appropriate materials can be selected for the organic layer 4 from the viewpoints of the light emission efficiency, the driving life, and the optical interference. The hole transport layer 41 can function as an electron blocking layer or a hole injection layer, and can also have a multilayered structure including a hole injection layer, a hole transport layer, and an electron blocking layer. The light emitting layer 42 can have a multilayered structure including light emitting layers for emitting different colors, and can also be a mixed layer in which light emitting dopants for emitting different colors are mixed. The electron transport layer 43 can function as a hole blocking layer or an electron injection layer, and can also have a multilayered structure including an electron injection layer, an electron transport layer, and a hole blocking layer.

The upper electrode 5 is continuously formed on the organic layer 4 in the direction along the upper surface of the substrate 1, and shared by the plurality of light emitting elements 10. Like the organic layer 4, the upper electrode 5 may also be integrally formed on the entire surface of the display region, which displays an image, of the organic device 100. The upper electrode 5 can also function as a semi-transmitting reflection layer (that is, a layer having semi-transmitting reflectivity) that transmits a part of light having reached the lower surface of the upper electrode 5, and reflects the rest of the light. The upper electrode 5 can be made of a metal such as magnesium or silver, an alloy containing magnesium or silver as a main component, or an alloy material containing an alkali metal or an alkali earth metal. An oxide conductor or the like may also be used as the upper electrode 5. Furthermore, the upper electrode 5 can have a multilayered structure as long as the structure has an appropriate transmittance.

The encapsulating layer 6 contains a material having an extremely low transmittance to external oxygen or moisture, such as SiN or SiON formed by using CVD, or aluminum oxide, silicon oxide, or titanium oxide formed by using ALD (Atomic Layer Deposition). The encapsulating layer 6 can have either a monolayered structure or a multilayered structure, provided that the structure transmits light transmitted through the upper electrode 5 and has a sufficient moisture blocking performance.

The color filters 7 are formed on the encapsulating layer 6. In orthographic projection to the upper surface of the substrate 1, the boundary between color filters having different colors of the color filters 7 can be formed to overlap the inter-element electrode 11. The color filters 7 can be formed in tight contact with each other like the color filters 7R and 7G shown in FIG. 1. The color filters 7 may also have different film thicknesses and overlap each other in the position of the inter-element electrode 11, like the color filters 7G and 7B shown in FIG. 1. As will be described in detail later, it is important that the boundary between the color filters 7 having different colors is not formed on the recess 13.

Next, the suppression of a leak of the driving current between adjacent light emitting elements 10 will be explained. The driving current leaks through the organic layer 4 between adjacent light emitting elements 10, because holes injected from the lower electrode 2 diffuse in the direction along the upper surface of the substrate 1. A driving force for diffusing the holes is a Poisson field formed by the holes as carriers. In this embodiment, a line of electric force is formed between the inter-element electrode 11 and the upper electrode 5 by increasing the potential of the inter-element electrode 11. Since this facilitates recombination of holes around the inter-element electrode 11, a leak between the light emitting elements 10 is suppressed. When the recess 13 is formed between the lower electrode 2 and the inter-element electrode 11, the film thickness of the organic layer 4 in the recess 13 can be decreased. As a consequence, the resistance of the organic layer 4 in the direction along the upper surface of the substrate 1 increases, so the resistance in the direction perpendicular to the upper surface of the substrate 1 can be decreased. This makes it possible to dramatically increase the hole recombination probability in the recess 13, when compared to a case in which no recess 13 is formed. That is, if there is no recess 13, the film thickness of the organic layer 4 between the lower electrode 2 and the inter-element electrode 11 becomes equal to that of the organic layer 4 on the lower electrode 2. Therefore, when compared to a case in which the recess 13 is formed between the lower electrode 2 and the inter-element electrode 11, the resistance of the organic layer 4 in the direction along the upper surface of the substrate 1 decreases, and the resistance in the direction perpendicular to the upper surface of the substrate 1 increases. Consequently, the hole recombination probability decreases between the lower electrode 2 and the inter-element electrode 11, and this increases the number of holes leaking between adjacent light emitting elements 10 over the boundary between the color filters 7. As a result, light generated by recombination of the leakage holes passes through the color filter 7 having a different color, and the color gamut decreases.

Furthermore, it is more effective to form the boundary between the color filters 7 having different colors not on the recess 13 but on the inter-element electrode 11. This will be explained by taking the light emitting element 10R as an example. Of holes injected from the lower electrode 2R, most of components having diffused in the lateral direction (the direction along the upper surface of the substrate 1) recombine in the recess 13R. Light generated by this recombination in the recess 13R passes through the color filter 7R, and this suppresses color mixture caused when the light passes through the color filter 7G of an adjacent light emitting element. This makes it possible to prevent a decrease in color gamut.

According to the results of study by the present inventors, the depth of the recess 13 is more effectively equal to or larger than the thickness of the lower electrode 2 and the inter-element electrode 11 as described previously. For example, the depth of the recess 13 can be 100 nm or more. In this case, the bottom of the recess 13 can be formed in the insulating layer 3, and the upper surface of the substrate 1 can also be exposed to the bottom of the recess. Also, when the distance between the lower electrode 2 and the inter-element electrode 11 was 0.3 μm or less, it was possible to obtain the effect after the step of forming the insulating layer 3 regardless of the deposition method and the type of film to be deposited. The distance between the lower electrode 2 and the inter-element electrode 11 may also be 0.2 μm or less.

Figure 5:
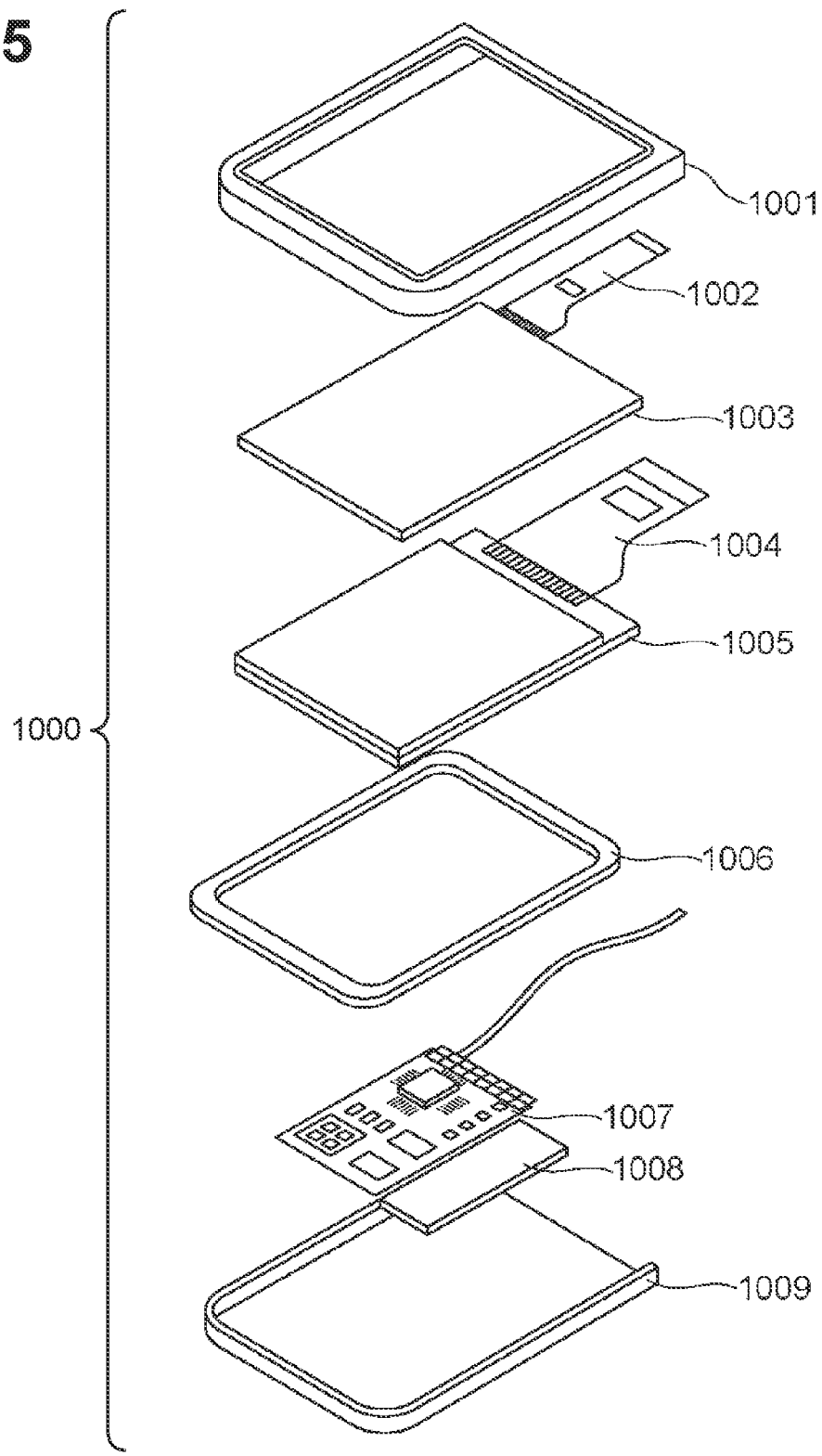
FIG. 5 is a view showing an example of a display apparatus using the organic device shown in FIG. 1.

Application examples in which the organic device 100 of this embodiment is applied to a display apparatus, an imaging apparatus, a portable apparatus, an illumination apparatus, and a mobile apparatus will be explained below with reference to FIGS. 5 to 10. FIG. 5 is a schematic view showing an example of the display apparatus using the organic device 100 of this embodiment. A display apparatus 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are formed on the circuit board 1007. The battery 1008 is unnecessary if the display apparatus 1000 is not a portable apparatus. Even when the display apparatus 1000 is a portable apparatus, the battery 1008 need not be installed in this position. The above-described organic device 100 is used as the display panel 1005. The organic device 100 that functions as the display panel 1005 operates by being connected to the active elements such as transistors formed on the circuit board 1007.

The display apparatus 1000 shown in FIG. 5 may also be used as a display unit of an imaging apparatus including an optical unit having a plurality of lenses, and an imaging element for receiving light having passed through the optical unit. This imaging apparatus can have a display unit for displaying information obtained by the imaging element. In addition, the display unit can be either a display unit exposed outside the imaging apparatus, or a display unit installed in the finder. The imaging apparatus may also be a digital camera or a digital video camera.

Figure 6:
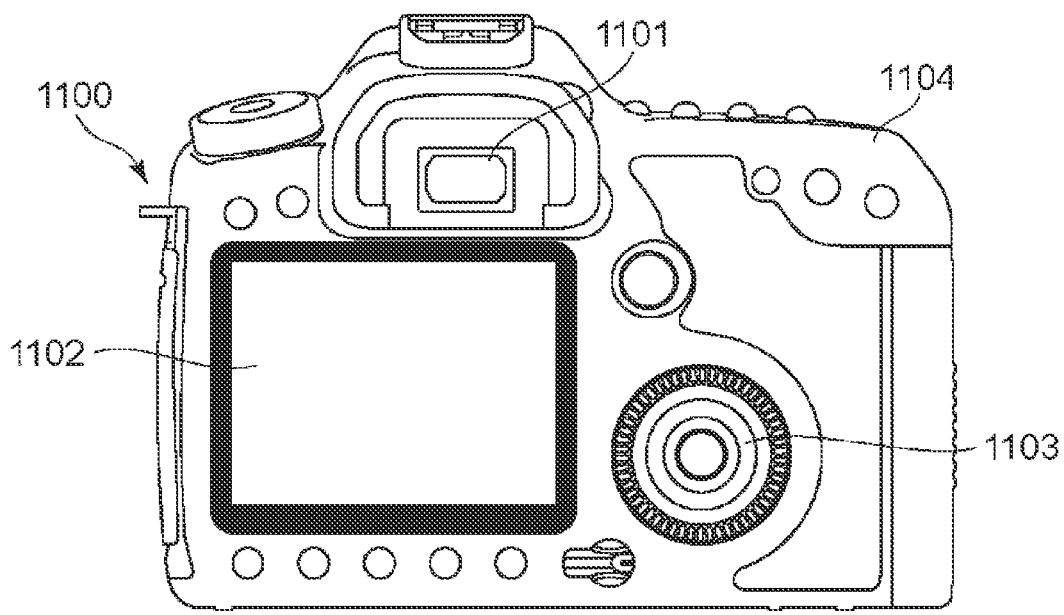
FIG. 6 is a view showing an example of an imaging apparatus using the organic device shown in FIG. 1.

FIG. 6 is a schematic view showing an example of the imaging apparatus using the organic device 100 of this embodiment. An imaging apparatus 1100 can include a view finder 1101, a back display 1102, an operation unit 1103, and a housing 1104. The above-described organic device 100 is used as the view finder 1101 as a display unit. In this case, the organic device 100 can display not only an image to be captured but also environment information, imaging instructions, and the like. Examples of the environment information are the intensity and direction of external light, the moving velocity of an object, and the possibility that an object is covered with an obstacle. The above-described organic device 100 can also be used as the back display 1102.

The timing suitable for imaging is often a very short time, so the information is preferably displayed as soon as possible. Accordingly, the above-described organic device 100 can be used as the view finder 1101. This is so because the light emitting layer 42 using an organic material has a high response speed. The organic device 100 including the light emitting layer 42 using an organic material is more suitable for these apparatuses required to have a high display speed, than a liquid crystal display device.

The imaging apparatus 1100 includes an optical unit (not shown). This optical unit has a plurality of lenses, and forms an image of light having passed through the optical unit on an imaging element (not shown) that is accommodated in the housing 1104 and receives the light. The focal points of the plurality of lenses can be adjusted by adjusting the relative positions. This operation can also automatically be performed.

The organic device 100 can also include a color filter that transmits red light, green light, and blue light. In this color filter, red, green, and blue can be arranged in the form of a delta array.

The above-described organic device 100 that contains an organic light-emitting material and functions as a light-emitting device can also be used as a display unit of a portable terminal. In this case, the organic device 100 can have both a display function and an operation function. Examples of the portable terminal are a portable phone such as a smartphone, a tablet, and a head mounted display.

Figure 7:
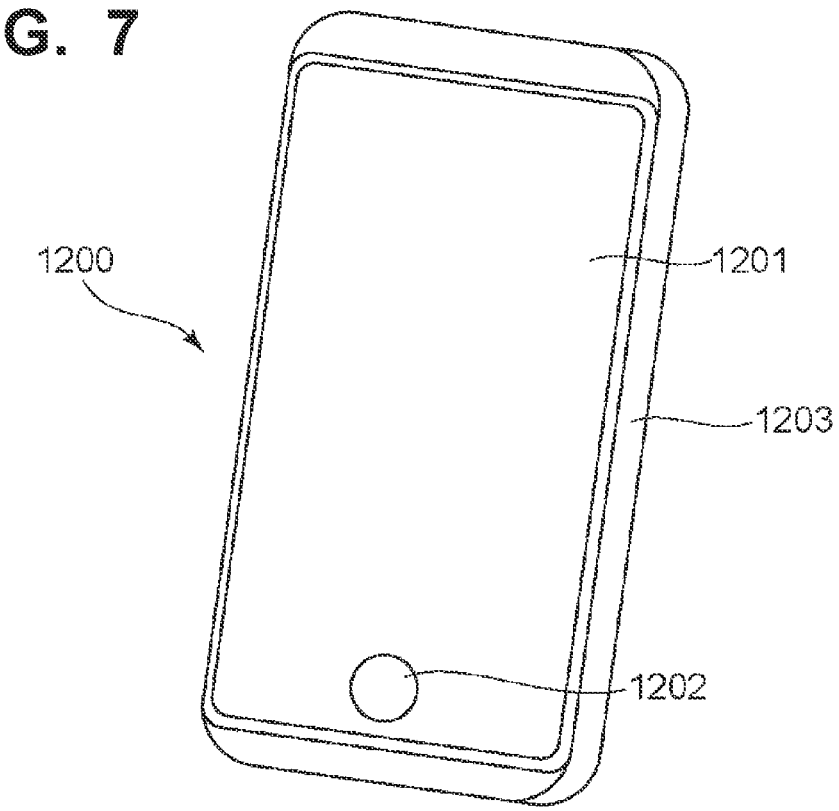
FIG. 7 is a view showing an example of a portable apparatus using the organic device shown in FIG. 1.

FIG. 7 is a schematic view showing an example of the portable apparatus using the organic device 100 of this embodiment. A portable apparatus 1200 includes a display unit 1201, an operation unit 1202, and a housing 1203. The housing 1203 can accommodate a circuit, a printed board having this circuit, a battery, and a communication unit. The operation unit 1202 can be either a button or a touch-panel-type reaction unit. The operation unit 1202 can also be a biometric authentication unit that performs unlocking or the like by authenticating the fingerprint. A portable apparatus including a communication unit can also be regarded as a communication apparatus. The above-described organic device 100 is used as the display unit 1201.

Figure 8A:
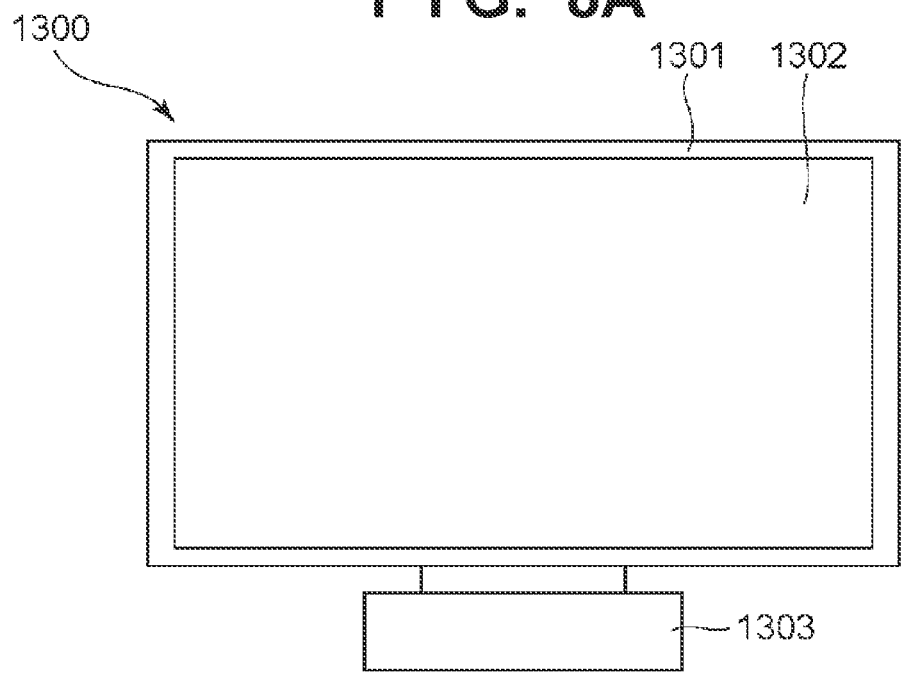
FIGS. 8A and 8B are views each showing an example of a display apparatus using the organic device shown in FIG. 1.
Figure 8B:
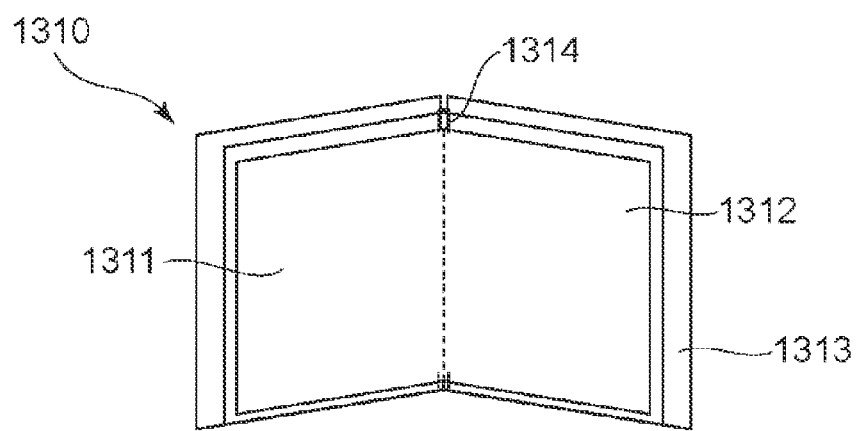

FIGS. 8A and 8B are schematic views showing examples of the display apparatus using the organic device 100 of this embodiment. FIG. 8A shows a display apparatus such as a television monitor or a PC monitor. A display apparatus 1300 includes a frame 1301 and a display unit 1302. The above-described organic device 100 is used as the display unit 1302. The display apparatus 1300 may also include a base 1303 that supports the frame 1301 and the display unit 1302. The base 1303 is not limited to the form shown in FIG. 8A. For example, the lower side of the frame 1301 may also function as the base 1303. In addition, the frame 1301 and the display unit 1302 can be bent. The radius of curvature in this case can be 5,000 (inclusive) to 6,000 (inclusive) mm.

FIG. 8B is a schematic view showing another example of the display apparatus using the organic device 100 of this embodiment. A display apparatus 1310 shown in FIG. 8B can be folded, that is, the display apparatus 1310 is a so-called foldable display apparatus. The display apparatus 1310 includes a flexible substrate (not shown), a first display unit 1311 and a second display unit 1312 formed on the flexible substrate, a housing 1313, and a bending point 1314. The above-described organic device 100 is used as each of the first display unit 1311 and the second display unit 1312. In this case, the above-described substrate 1 can be the flexible substrate, or the above-described organic device 100 can be mounted as each of the first display unit 1311 and the second display unit 1312 on the flexible substrate. The first display unit 1311 and the second display unit 1312 can also be one seamless display device. The first display unit 1311 and the second display unit 1312 can be divided from the bending point. The first display unit 1311 and the second display unit 1312 can display different images, and can also display one image together.

Figure 9:
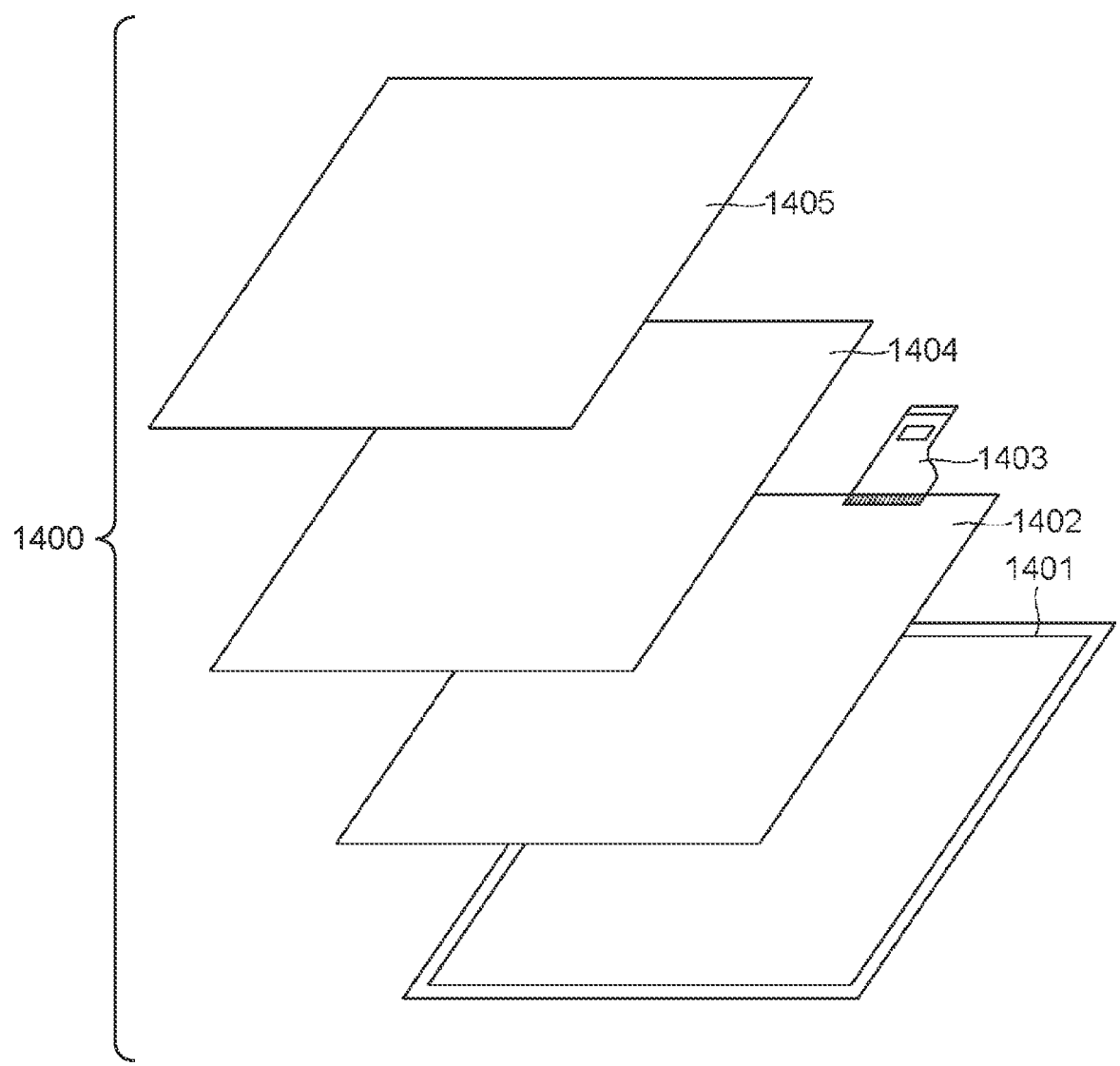
FIG. 9 is a view showing an example of an illumination apparatus using the organic device shown in FIG. 1.

FIG. 9 is a schematic view showing an example of the illumination apparatus using the organic device 100 of this embodiment. An illumination apparatus 1400 can include a housing 1401, a light source 1402, a circuit board 1403, an optical film 1404, and a light-diffusing unit 1405. The above-described organic device 100 is used as the light source 1402. The optical film 1404 can be a filter that improves the color rendering of the light source. When performing lighting-up or the like, the light-diffusing unit 1405 can throw the light of the light source over a broad range by effectively diffusing the light. The illumination apparatus 1400 can also include a cover on the outermost portion. The illumination apparatus 1400 can include both the optical film 1404 and the light-diffusing unit 1405, and can also include only one of them.

The illumination apparatus 1400 is an apparatus for illuminating the room or the like. The illumination apparatus 1400 can emit white light, natural white light, or light of any color from blue to red. The illumination apparatus 1400 can also include a light control circuit for controlling these light components. The illumination apparatus 1400 can also include a power supply circuit to be connected to the organic device 100 that functions as the light source 1402. This power supply circuit can be a circuit for converting an AC voltage into a DC voltage. "White" has a color temperature of about 4,200 K, and "natural white" has a color temperature of about 5,000 K. The illumination apparatus 1400 may also have a color filter. In addition, the illumination apparatus 1400 can have a heat radiation unit. The heat radiation unit radiates the internal heat of the apparatus to the outside of the apparatus, and examples are a metal having a high specific heat and liquid silicon.

FIG. 10 is a schematic view of an automobile including a taillight as an example of a vehicle lighting appliance using the organic device 100 of this embodiment. An automobile 1500 has a taillight 1501, and the taillight 1501 is turned on when performing a braking operation or the like. The automobile 1500 is an example of a mobile apparatus, and the taillight 1501 is an example of a mobile apparatus lighting appliance. The mobile apparatus is not limited to an automobile, and can also be a ship, a drone, an airplane, a railway vehicle, or the like. This mobile apparatus can include a main body and a mobile apparatus lighting appliance installed in the main body. The mobile apparatus lighting appliance may also be an apparatus that notifies the current position of the main body.

The organic device 100 is used as the taillight 1501. The taillight 1501 can have a protection member for protecting the organic device 100 that functions as the taillight 1501. The material of the protection member is not limited as long as the material has strength that is high to some extent and transmits light emitted by the organic device 100, and can be polycarbonate. The protection member can also be formed by mixing a furandicarboxylic acid derivative or an acrylonitrile derivative in polycarbonate.

The automobile 1500 can include a body 1503, and a window 1502 attached to the body 1503. This window can be a window for checking the front and back of the automobile, and can also be a transparent display. The above-described organic device 100 can be used as this transparent display. In this case, the constituent materials such as the electrodes of the organic device 100 are formed by transparent members.

A thin-film transistor (TFT) as an example of a switching element controls the light emission luminance and light emission timing of the light emitting element 10 according to this embodiment. An image can be displayed by forming a plurality of light emitting elements 10 on the upper surface of the substrate 1. The switching element is not limited to a TFT, and may also be a transistor, an MIM element, or an active matrix driver formed on a substrate such as an Si substrate. "Formed on a substrate such as an Si substrate" includes a layer formed inside an Si substrate. This is selected in accordance with the resolution. For example, when the resolution is about QVGA per inch, an organic light emitting element can be formed on an Si substrate. When the organic device 100 including the light emitting elements 10 having the organic layer 4 using the above-described organic materials is driven as the display apparatus and the like shown in FIGS. 5 to 10, images can stably be displayed for a long time with a high image quality.

Examples of the organic device 100 of this embodiment will be explained below. First, the lower electrodes 2 and the inter-element electrodes 11 shown in FIG. 1 were formed on the substrate 1. That is, a metal layer using a metal material was formed on the substrate 1, and desired regions of the metal layer were etched by using mask patterns or the like, thereby forming the inter-element electrodes 11 and the lower electrodes 2 by the same metal layer. Then, the insulating layer 3 was so formed as to cover the lower electrodes 2 and the inter-element electrodes 11. In this embodiment, the insulating layer 3 was formed by using silicon oxide, and the film thickness of the insulating layer 3 on the upper surfaces of the lower electrodes 2 and the inter-element electrodes 11 in the direction perpendicular to the upper surface of the substrate 1 was 65 nm. After the insulating layer 3 was formed, the opening regions 12 and the recesses 13 were formed by etching desired regions of the insulating layer 3 by using mask patterns or the like. The taper angle 14 in the portion 31 of the sidewall of the recess 13 of the insulating layer 3 was 75°. Also, the taper angle of the sidewall of the insulating layer 3 of the opening region 12 was 80°. In this example, a pixel array was a delta array, the distance between adjacent opening regions 12 was 1.4 µm, the distance between adjacent lower electrodes 2 was 0.6 µm, and the distance between the lower electrode 2 and the inter-element electrode 11 was 0.2 µm.

Subsequently, the organic layer 4 was formed. First, a 3-nm thick material indicated by compound 1 below was deposited as a hole injection layer on the substrate 1.

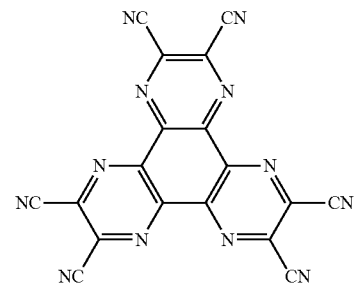

Compound 1

Then, a 15-nm thick material indicated by compound 2 below was deposited as a hole transport layer, and 10-nm thick HT27 indicated by compound 3 below was deposited as an electron blocking layer. The light emitting layer 42 was given a two-layered structure. First, a material indicated by compound 5 below as a light emitting dopant was mixed at a weight ratio of 3% in a material indicated by compound 4 below as a host material, and a 10-nm thick first light emitting layer was deposited by using the material mixture. The hole mobilities of the hole transport layer, the electron blocking layer, and the host material of the first light emitting layer were measured and found to be $2\times10^{-3}$, $5\times10'$, and $1\times10^{-3}$ [cm/V·sec], respectively.

Compound 2

Compound 3

Compound 4

Compound 5

Subsequently, a material indicated by compound 6 below as a light emitting dopant was mixed at a weight ratio of 1% in the material indicated by compound 4 above as a host material, and a 10-nm thick second light emitting layer was deposited by using the material mixture. After the light emitting layer 42 having the two-layered structure was formed, a 110-nm thick material indicated by compound 7 below was deposited as an electron transport layer, and 0.5-nm thick LiF was deposited as an electron injection layer.

Compound 6

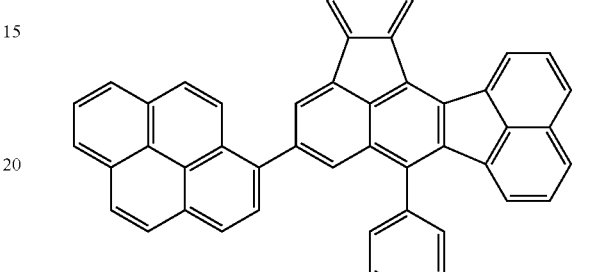

Compound 7

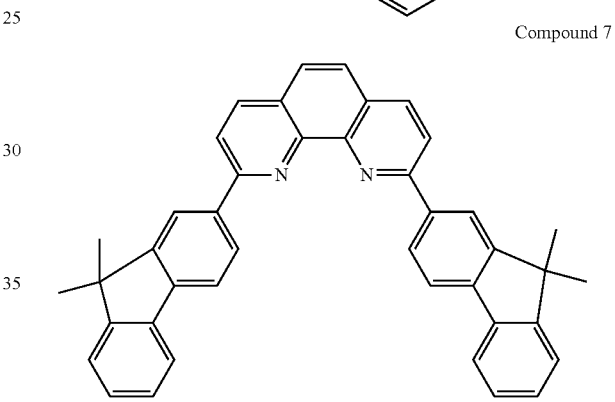

After the organic layer 4 was formed, a 10-nm thick MgAg alloy in which the ratio of Mg to Ag was 1:1 was deposited as the upper electrode 5. After the upper electrode 5 was formed, 1.5-μm thick SiN was deposited as the encapsulating layer 6 by using CVD. After the encapsulating layer 6 was formed, the color filters 7 were formed such that the boundary between the color filters 7 having different colors overlapped the inter-element electrode 11 in orthographic projection to the upper surface of the substrate 1.

Figure 3:
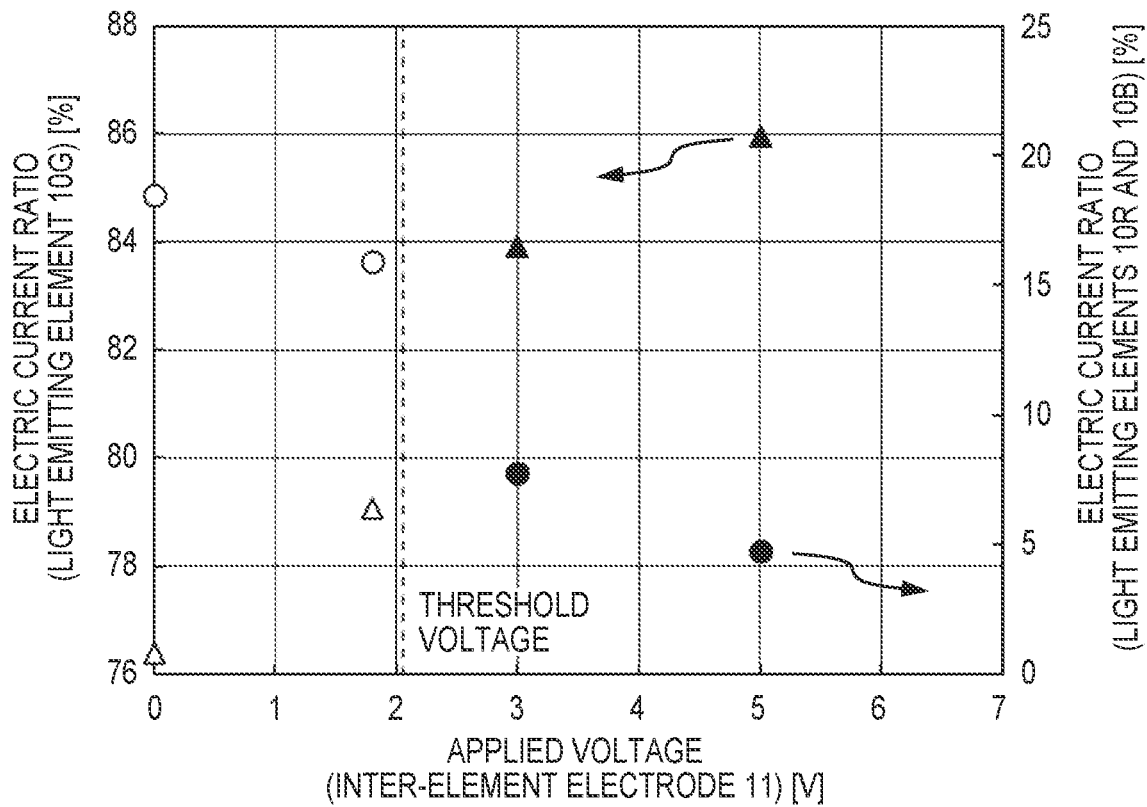
FIG. 3 is a graph showing the relationship between the ratio of an electric current flowing through a light emitting element emitting light to an electric current flowing through a light emitting element adjacent to the light emitting element emitting light, and a voltage to be applied to an inter-element electrode, in the organic device in FIG. 1.

The characteristics of the formed organic device 100 will be explained below. FIG. 3 shows the relationship between the ratio of an electric current flowing through the light emitting element 10 emitting light to an electric current flowing through the light emitting element 10 that was adjacent to the light emitting element 10 emitting light and displayed black, and a voltage applied to the inter-element electrode 11. In this example, measurement was performed by causing the light emitting element 10G shown in FIG. 1 to emit light, and causing the light emitting elements 10R and 10B adjacent to each other to display black. In this measurement, a current density input to the light emitting element 10G was 0.11 mA/cm$^2$, and a current density equivalent to black display was input to the light emitting elements 10R and 10B. Based on the obtained emission spectra, the ratios of electric currents flowing through the light emitting elements 10G, 10R, and 10B shown in FIG. 3 were calculated. Referring to FIG. 3, triangular plots indicate the measurement result of the light emitting element 10G, and the ordinate is the left axis. Also, round plots indicate the measurement result of the light emitting elements 10R and 10B, and the ordinate is the right axis. In addition, plots in a region where the voltage to be applied to the inter-element electrode 11 was higher than a threshold voltage at which the light emitting layer 42 started emitting light are solid, and plots in a region where the application voltage was lower than the threshold voltage are hollow.

Next, a method of calculating the electric current ratios of the light emitting elements 10G, 10R, and 10B will be explained. The current density dependence of the emission spectrum data of the light emitting element 10 is measured under the condition that no color mixture occurs due to a leak of the driving current between the light emitting elements 10, that is, under the condition that adjacent light emitting elements 10 are short-circuited. In this measurement, the current value of the upper electrode 5 is measured as an electric current flowing through each light emitting element 10. Based on the obtained current density dependences of the light emitting elements 10, the emission spectra are reproduced when the light emitting element 10G is caused to emit light and the light emitting elements 10R and 10B are caused to display black, thereby calculating the ratios of distribution to the light emitting elements 10G, 10R, and 10B with respect to the input electric current. That is, a leak between the light emitting elements 10 is suppressed as the ratio of the electric current flowing through the light emitting element 10G emitting light increases, and the ratio of the electric currents flowing through the adjacent light emitting elements 10R and 10B displaying black decreases.

A term "voltage" used in this specification is the potential difference between electrodes when the upper electrode 5 is a reference. That is, the potential of the lower electrode 2 based on the potential of the upper electrode 5 is called a voltage to be applied to the lower electrode 2, and the potential of the inter-element electrode 11 based on the potential of the upper electrode 5 is called a voltage to be applied to the inter-element electrode 11. Accordingly, a voltage to be applied to the lower electrode 2 has a positive value or a negative value in accordance with whether the upper electrode 5 is a cathode or an anode. More specifically, when the upper electrode 5 is a cathode, the lower electrode 2 is an anode, so the voltage to be applied to the lower electrode 2 has a positive value. On the other hand, when the upper electrode 5 is an anode, the lower electrode 2 is a cathode, so the voltage to be applied to the lower electrode 2 has a negative value. In this example, measurement was performed by using the upper electrode 5 as a cathode and the lower electrode 2 as an anode. Also, a voltage having the same polarity as that of the lower electrode 2 was applied to the inter-element electrode 11.

FIG. 3 shows that when the voltage to be applied to the inter-element electrode 11 was 0 V, the ratio of the electric current flowing through the light emitting element 10G emitting light was about 77%, and that of the electric currents flowing through the light emitting elements 10R and 10B displaying black was about 17.5%. When the voltage to be applied to the inter-element electrode 11 was raised, the ratio of the electric current flowing through the light emitting element 10G increased, and that of the electric currents flowing through the light emitting elements 10R and 10B decreased. When the voltage to be applied to the inter-element electrode 11 was 3 V, the ratio of the electric current flowing through the light emitting element 10G emitting light was about 84%, and that of the electric currents flowing through the light emitting elements 10R and 10B displaying black was about 8%. Especially in the vicinity of the threshold voltage (in this example, the threshold voltage was about 2 V) as a minimum value of the voltage to be applied to the lower electrode 2 when the light emitting layer 42 emitted light, the increase rate of the ratio of the electric current flowing through the light emitting element 10G emitting light and the decrease rate of the ratio of the electric current flowing through the light emitting elements 10R and 10B displaying black were high.

The results of examination reveal that when a voltage of 2 V or more as the threshold voltage was applied to the inter-element electrode 11, the effect of suppressing a leak of the driving current between the light emitting elements 10 was high. That is, when driving the organic device 100, the effect of suppressing a leak between the light emitting elements 10 was improved by applying a voltage having the same polarity as that of the threshold voltage of the light emitting layer 42 and having an absolute value equal to or larger than the absolute value of the threshold voltage.

Also, while the light emitting element 10G was emitting light, the light emitting elements 10R and 10B were displaying black, and the voltage was applied to the inter-element electrode 11, in other words, while the organic device 100 was driven, no steady electric current flowed through the inter-element electrode 11. This is so because the inter-element electrode 11 is electrically independent of the lower electrode 2 and the upper electrode 5, and the insulating layer 3 is formed between the inter-element electrode 11 and the organic layer 4.

Figure 4:
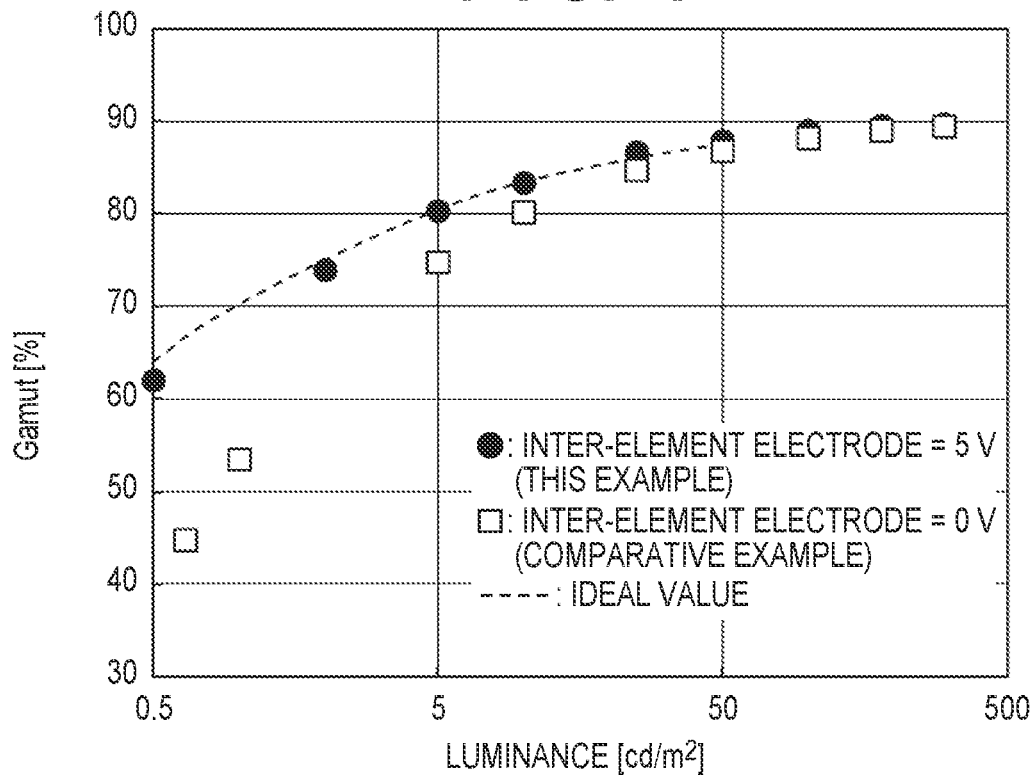
FIG. 4 is a graph showing the relationship between the luminance and the color gamut of the organic device shown in FIG. 1.

FIG. 4 shows the relationship between the luminance of a white spectrum of the light emitting element 10 emitting light and the color gamut. From the results shown in FIG. 3, round plots indicate the result obtained when a voltage of 5 V was applied to the inter-element electrode 11 as this example, and square plots indicate the result obtained when 0 V was applied to the inter-element electrode 11 as a comparative example. Also, the dotted line indicates the relationship between the luminance and the color gamut when a voltage to be applied to the lower electrodes 2 of adjacent light emitting elements 10 was 0 V as an ideal system in which no leak of the driving current occurs between the light emitting elements 10. As shown in FIG. 4, when 5 V was applied to the inter-element electrode 11, the color gamut improved in a low-luminance region and almost matched the ideal system, compared to the case in which 0 V was applied to the inter-element electrode 11. This reveals that the application of a voltage equal to or higher than the threshold voltage to the inter-element electrode 11 is effective not only for the light emitting element 10G emitting light but also for the light emitting elements 10R and 10B displaying black. In this example as described above, it is possible to suppress a leak of the driving current between the light emitting elements 10 and suppress a crosstalk between the light emitting elements 10 while holding the current controllability in a low-luminance region.

In this embodiment and this example, the explanation has been made by taking, as an example, the organic device 100 using the organic layer 4 emitting white light and the color filters 7 having different colors. However, the arrangement of the organic device 100 is not limited to this. For example, even in an organic device using no color filters 7, a crosstalk is suppressed by suppressing a leak of the driving current between adjacent light emitting elements 10, and the resolution of an image to be displayed improves. Also, the emission color of the organic layer 4 is not limited to white, and can be an appropriate color in accordance with the specifications required of the organic device.

One embodiment of the present invention can provide a technique advantageous in suppressing a leak between light emitting elements in an organic device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-118192, filed Jun. 21, 2018, which is hereby incorporated by reference herein in its entirety.

What is claimed is:

1. An organic device comprising a substrate and a plurality of light emitting elements formed on a first surface of the substrate,
   wherein each of the plurality of light emitting elements includes, from a side of the first surface, a first electrode, an organic layer formed on the first electrode and including a light emitting layer, and a second electrode formed on the organic layer,
   the organic device further comprises a third electrode formed between the first electrodes of adjacent light emitting elements of the plurality of light emitting elements, and an insulating layer covering a portion between the first electrode and the third electrode, an end portion of the first electrode, and an end portion of the third electrode, and
   the insulating layer includes a recess between the first electrode and the third electrode,
   wherein the insulating layer separates the third electrode from the organic layer.

2. The device according to claim 1, wherein the recess has a depth not less than a thickness of the first electrode and the third electrode in a direction perpendicular to the first surface.

3. The device according to claim 1, wherein the plurality of light emitting elements share the organic layer.

4. The device according to claim 1, wherein the organic layer is formed in the recess.

5. The device according to claim 1, wherein the insulating layer covers the third electrode.

6. The device according to claim 1, wherein when a potential of the third electrode based on a potential of the second electrode is a voltage to be applied to the third electrode, a potential of the first electrode based on the potential of the second electrode is a voltage to be applied to the first electrode, and a minimum value of the voltage to be applied to the first electrode when the light emitting layer emits light is a threshold voltage,
   a voltage having the same polarity as that of the threshold voltage and having an absolute value not less than an absolute value of the threshold voltage is applied to the third electrode while the organic device is driven.

7. The device according to claim 1, wherein
   a sidewall of the recess includes a first portion having a predetermined taper angle to the first surface, and a second portion formed between the first portion and an upper surface of the insulating layer and having an angle that changes with respect to the first surface, and
   a film thickness of the organic layer in the second portion in a direction perpendicular to the second portion and a film thickness of the organic layer on a bottom surface of the recess in a direction perpendicular to the first surface are smaller than a film thickness of a portion of the organic layer, which is in contact with the first electrode, in the direction perpendicular to the first surface.

8. The device according to claim 7, wherein the predetermined taper angle is 60° (inclusive) to 90° (inclusive).

9. The device according to claim 1, wherein the first electrode and the third electrode are formed at the same height in a direction perpendicular to the first surface.

10. The device according to claim 1, wherein a film thickness of a portion of the insulating layer, which covers the third electrode, in a direction perpendicular to the first surface is 40 (inclusive) to 150 (inclusive) nm.

11. The device according to claim 1, further comprising an encapsulating layer formed to cover the second electrode, and a plurality of color filters formed on the encapsulating layer corresponding to each of the plurality of light emitting elements,
   wherein in orthographic projection to the first surface, a boundary between color filters having different colors of the plurality of color filters is formed to overlap the third electrode.

12. The device according to claim 11, wherein in orthographic projection to the first surface, color filters having different colors of the plurality of color filters overlap each other in a position overlapping the third electrode.

13. The device according to claim 1, wherein a depth of the recess in a direction perpendicular to the first surface is not less than 100 nm.

14. The device according to claim 1, wherein each of the plurality of light emitting elements emits white light.

15. The device according to claim 1, wherein a distance between the first electrode and the third electrode is not more than 0.3 μm.

16. A display apparatus comprising an organic device according to claim 1, and an active element connected to the organic device.

17. An imaging apparatus comprising an optical unit including a plurality of lenses, an imaging element configured to receive light having passed through the optical unit, and a display unit configured to display an image,
   wherein the display unit displays an image captured by the imaging element, and includes an organic device according to claim 1.

18. An illumination apparatus comprising a light source and at least one of a light diffusing unit and an optical film,
   wherein the light source includes an organic device according to claim 1.

19. A mobile apparatus lighting appliance comprising an organic device according to claim 1, and a protection member configured to protect the organic device.

20. A mobile apparatus comprising a main body and a lighting appliance attached to the main body,
   wherein the lighting appliance includes an organic device according to claim 1.

* * * * *